US008928349B2

(12) United States Patent
Oh et al.

(10) Patent No.: US 8,928,349 B2
(45) Date of Patent: Jan. 6, 2015

(54) ON-DIE TERMINATION CIRCUIT, SEMICONDUCTOR MEMORY DEVICE AND MEMORY SYSTEM

(71) Applicants: Ki-Seok Oh, Uiwang-Si (KR); Joon-Young Park, Seoul (KR); Yong-Hun Ahn, Seoul (KR); Yong-Cheol Bae, Yongin-Si (KR); Yong-Gwon Jeong, Uiwang-Si (KR); Jong-Hyun Choi, Seoul (KR)

(72) Inventors: Ki-Seok Oh, Uiwang-Si (KR); Joon-Young Park, Seoul (KR); Yong-Hun Ahn, Seoul (KR); Yong-Cheol Bae, Yongin-Si (KR); Yong-Gwon Jeong, Uiwang-Si (KR); Jong-Hyun Choi, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 164 days.

(21) Appl. No.: 13/755,418

(22) Filed: Jan. 31, 2013

(65) Prior Publication Data
US 2014/0028345 A1 Jan. 30, 2014

(30) Foreign Application Priority Data

Jul. 25, 2012 (KR) .................. 10-2012-0081408
Oct. 30, 2012 (KR) .................. 10-2012-0121492

(51) Int. Cl.
H03K 17/16 (2006.01)
H03K 19/003 (2006.01)
H03K 19/0175 (2006.01)
H04L 25/02 (2006.01)
G11C 7/10 (2006.01)

(52) U.S. Cl.
CPC .... H03K 19/017545 (2013.01); H03K 19/0175 (2013.01); H04L 25/0264 (2013.01); G11C 7/1057 (2013.01); G11C 2207/2272 (2013.01)
USPC ............................. 326/30; 365/63

(58) Field of Classification Search
USPC ................... 326/30, 23, 27; 365/63
See application file for complete search history.

(56) References Cited

U.S. PATENT DOCUMENTS

| 6,809,546 | B2 | 10/2004 | Song et al. |
| 7,092,299 | B2 | 8/2006 | Kwak et al. |
| 7,554,353 | B2 | 6/2009 | Lee et al. |
| 7,671,622 | B2 | 3/2010 | Oh et al. |
| 7,786,752 | B2 | 8/2010 | Oh et al. |
| 7,868,650 | B2 | 1/2011 | Kim |
| 8,035,412 | B2 | 10/2011 | Choo et al. |
| 8,315,122 | B2 | 11/2012 | Jo et al. |
| 2007/0222476 | A1* | 9/2007 | Lee ............................. 326/30 |
| 2009/0115450 | A1 | 5/2009 | Kim et al. |
| 2009/0256587 | A1 | 10/2009 | Kuboyama et al. |
| 2012/0081146 | A1 | 4/2012 | Oh et al. |

FOREIGN PATENT DOCUMENTS

| KR | 10-0468728 | 10/2005 |
| KR | 100734320 B1 | 6/2007 |
| KR | 1020090108800 A | 10/2009 |
| KR | 10-0960012 | 5/2010 |
| KR | 1020100078197 A | 7/2010 |
| KR | 1020100102924 A | 9/2010 |
| KR | 10-0991384 | 11/2010 |

* cited by examiner

*Primary Examiner* — Daniel D Chang
(74) *Attorney, Agent, or Firm* — Volentine & Whitt, PLLC

(57) ABSTRACT

An ODT circuit is activated/deactivated in response to a latency control signal or a clock enable signal. The ODT circuit includes an ODT control circuit and an ODT section. The ODT control circuit determines an ODT status based on a read latency control signal (RL) and/or a write latency control signal (WL) to generate an ODT control signal. The ODT section is activated/deactivated in response to the ODT control signal.

17 Claims, 15 Drawing Sheets

FIG. 5

| RL/WL | ODT STATUS EXAM. 1 OPX | ODT STATUS EXAM. 2 OPX |
|---|---|---|
| 6/3 | 0 (OFF) | 0 (OFF) |
| 8/4 | 0 (OFF) | 0 (OFF) |
| 9/5 | 0 (OFF) | 0 (OFF) |
| 10/6 | 0 (OFF) | 0 (OFF) |
| 11/6 | 0 (OFF) | 1 (ENABLE) |
| 12/6 | 1 (ENABLE) | 1 (ENABLE) |

ON-DIE TERMINATION CIRCUIT, SEMICONDUCTOR MEMORY DEVICE AND MEMORY SYSTEM

CROSS-REFERENCE TO RELATED APPLICATION

This application claims priority under 35 U.S.C. §119 to Korean Patent Application Nos. 10-2012-0081408 filed on Jul. 25, 2012 and 10-2012-0121492 filed on Oct. 30, 2012, the collective e subject matter of which is hereby incorporated by reference.

BACKGROUND

The inventive concept generally relates to semiconductor memory devices. More particularly, the inventive concept relates to semiconductor memory devices including at least one on-die termination circuit, and memory systems including such semiconductor memory device(s).

Many contemporary memory systems include one or more semiconductor memory devices configured to transmit/receive data and control signals with a memory controller via one or more signal buses or varying configurations (hereafter, singularly and collectively denoted, regardless of specific configuration as a "bus"). In this context, a bus is any conductive element (e.g., wire, trace, pad, bump, via, semiconductor region, etc.) or collection of conductive elements intended to communicate one or more electrical signal between circuit points. As is well understood by those skilled in the art, the higher the frequency of the signal(s) being transmitted between circuit points (e.g., between a memory controller and related semiconductor memory devices), the greater the amount of distortion experienced by the signal(s).

Much of the signal distortion experienced at higher frequencies is associated with signal reflections and other noise resulting from mismatched impedances at different ends of a bus. To alleviate impedance mismatches and the resulting noise, signal lines of a bus undergo a "termination" process wherein a resistor and/or other discrete element is provide to better match the impedance of the signal line, thereby preventing or reducing signal distortion. Yet, the provision of termination elements on a bus has certain drawbacks, such as increased current consumption.

SUMMARY

Embodiments of the inventive concept provide an on-die termination (ODT) circuit capable of decreasing power consumption.

Embodiments of the inventive concept also provide a semiconductor memory device including the ODT circuit.

Embodiments of the inventive concept also provide a memory system including the ODT circuit.

In accordance with an aspect of the inventive concept, the ODT circuit comprises an ODT control circuit and an ODT section.

The ODT control circuit determines an ODT status based on a read latency control signal (RL) to generate an ODT control signal. The ODT section is activated/deactivated in response to the ODT control signal.

In an embodiment, the ODT circuit may compensate for an impedance mismatch of a data bus or a command/address bus in a memory system.

In still another embodiment, the ODT control circuit may generate the read latency control signal (RL) based on a column address strobe (CAS) latency signal and an internal clock signal.

In yet another embodiment, the ODT control circuit may generate the ODT control signal based on the read latency control signal (RL) and a write latency control signal (WL).

In yet another embodiment, the ODT circuit further comprises a pad electrically coupled to an external bus, an internal bus and the ODT section. The external bus may be a command/address (C/A) bus, or a data (DQ) bus.

In accordance with an aspect of the inventive concept, the ODT circuit comprises an ODT control circuit and an ODT section.

The ODT control circuit generates an ODT control signal based on a read latency control signal (RL) and an ODT status signal to. The ODT section is activated/deactivated in response to the ODT control signal.

In an embodiment, the ODT control circuit may receive the read latency control signal and the ODT status signal from a mode register write (MRW) register.

In accordance with an aspect of the inventive concept, a semiconductor memory device includes a latency control circuit and an ODT circuit.

The latency control circuit generates a read latency control signal (RL) based on a column address strobe (CAS) latency signal and an internal clock signal. The ODT circuit determines an ODT status based on the read latency control signal (RL) to generate an ODT control signal, and is activated/deactivated in response to the ODT control signal.

In accordance with another aspect of the inventive concept, a semiconductor memory device may include a pad and an ODT circuit. The ODT circuit is electrically coupled to the pad, and is activated/deactivated in response to a clock enable signal.

In accordance with an aspect of the inventive concept, during a power-down mode the clock enable signal is disabled.

In accordance with an aspect of the inventive concept, a memory system includes a memory controller configured to generate a command/address signal (CA) and a data signal, and a memory module. The memory module includes a plurality of semiconductor memory devices, each of which operates in response to the command/address signal (CA) and the data signal, and has an on-die termination (ODT) circuit. The ODT circuit includes the ODT control circuit and the ODT section. The ODT control circuit may include an ODT control circuit configured to generate an ODT control signal based on a read latency control signal (RL), and an ODT section configured to be activated/deactivated in response to the ODT control signal.

The ODT circuit according to embodiments of the inventive concept activates/deactivates a termination resistor based on the read latency control signal (RL) and/or a write latency control signal (WL). Therefore, a semiconductor memory device and a memory system including the ODT circuit may have small power consumption.

BRIEF DESCRIPTION OF THE DRAWINGS

The foregoing and other features and advantages of the inventive concept will become more apparent upon consideration of certain embodiments of the inventive concept illustrated in the accompanying drawings. The drawings are not necessarily to scale, but emphasize certain features and principles of the inventive concept. Throughout the drawings and written description, like reference numbers and labels are used to denote like or similar elements and features. In the drawings:

FIG. 5 is a table illustrating exemplary control signals including; a read latency control signal, a write latency control signal, as well as related ODT status for the ODT circuit of FIG. 4.

DETAILED DESCRIPTION

Certain embodiments of the inventive concept will now be described in some additional detail with reference to the accompanying drawings. The inventive concept may, however, be embodied in different forms and should not be construed as being limited to only the illustrated embodiments. Rather, these embodiments are provided so that this disclosure is thorough and complete and fully conveys the inventive concept to those skilled in the art.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
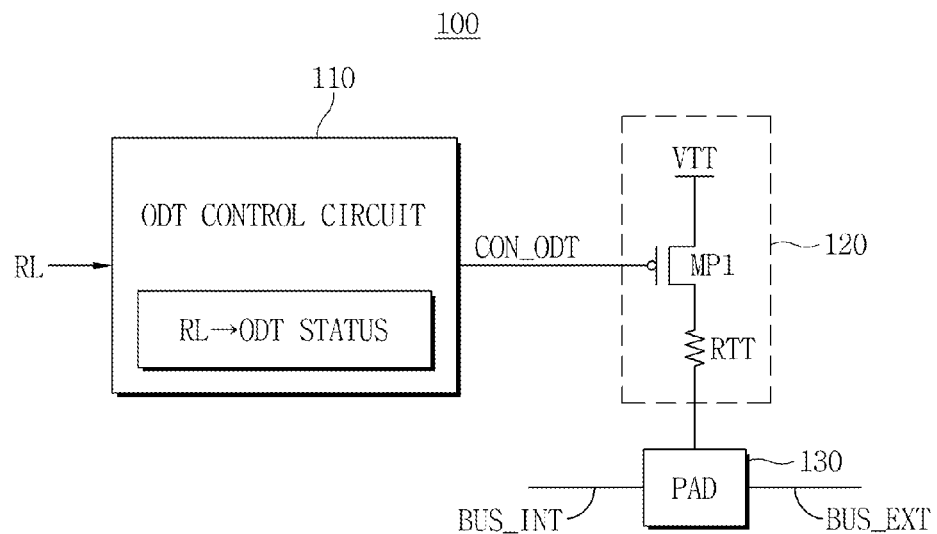
FIG. 1 is a circuit diagram of an on-die termination (ODT) circuit in accordance with an embodiment of the inventive concept.

FIG. 1 is a circuit diagram of an On-Die Termination (ODT) circuit 100 in accordance with an embodiment of the inventive concept. The ODT circuit 100 comprises an ODT control circuit 110 and an ODT section 120.

The ODT control circuit 110 determines an ODT status based on a read latency control signal (RL) in order to generate an ODT control signal (CON_ODT). The ODT section 120 is activated or deactivated (hereafter, denoted by the term "activated/deactivated") in response to the ODT control signal CON_ODT. As will be described hereinafter, the read latency control signal (RL) may be generated based on a column address strobe (CAS) latency signal and a read information signal. The read information signal may be generated based on an internal clock signal and a read command.

The ODT circuit 100 is associated with (i.e., configured to operate in conjunction with) an external bus BUS_EXT and an internal bus BUS_INT connected by a pad (or similar bus termination point) 130, wherein the pad 130 is electrically coupled to the ODT section 120. Collectively, the external bus BUS_EXT, internal bus BUS_INT, and pad 130 may be view as a bus in the illustrated embodiment of FIG. 1. The bus may operate as a command/address (C/A) bus, a data (DQ) bus, or a command/address/data (C/A/D) bus.

The ODT section 120 if FIG. 1 includes a PMOS transistor MP1 and a termination resistor RTT. The PMOS transistor MP1 may be turned ON/OFF in response to the ODT control signal CON_ODT, and the termination resistor RTT is connected between the PMOS transistor MP1 and pad 130.

The ODT circuit 100 may be used to compensate for potential impedance mismatches related to a bus in a memory system, such as those that may exist between one or more semiconductor memory device(s) and a memory controller. In other words, the ODT circuit 100 may be used to compensate for impedance mismatches associated with a data bus, a command/address (C/A) bus, and/or a command/address/data (C/A/D) bus in a memory system including one or more semiconductor memory devices.

Figure 2:
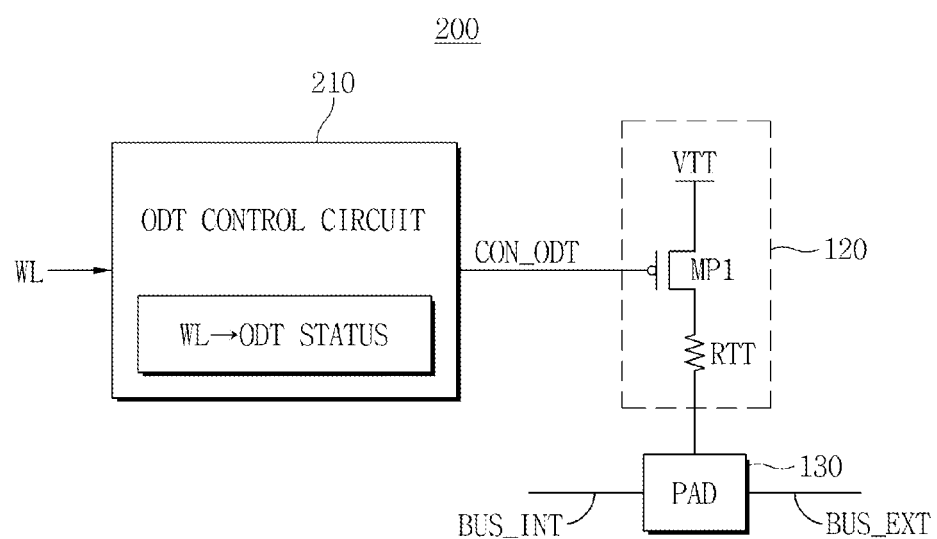
FIG. 2 is a circuit diagram of an ODT circuit in accordance with another embodiment of the inventive concept.

FIG. 2 is a circuit diagram of an ODT circuit 200 in accordance with another embodiment of the inventive concept. The ODT circuit 200 comprises an ODT control circuit 210 and an ODT section 120.

The ODT control circuit 210 determines an ODT status based on a write latency control signal (WL) in order to generate the ODT control signal (CON_ODT). The ODT section 120 may be activated/deactivated in response to the ODT control signal CON_ODT. As will be described hereinafter, the write latency control signal (WL) may be generated based on a column address strobe (CAS) latency signal and a write information signal. The write information signal may be generated based on an internal clock signal and a write command.

Figure 3:
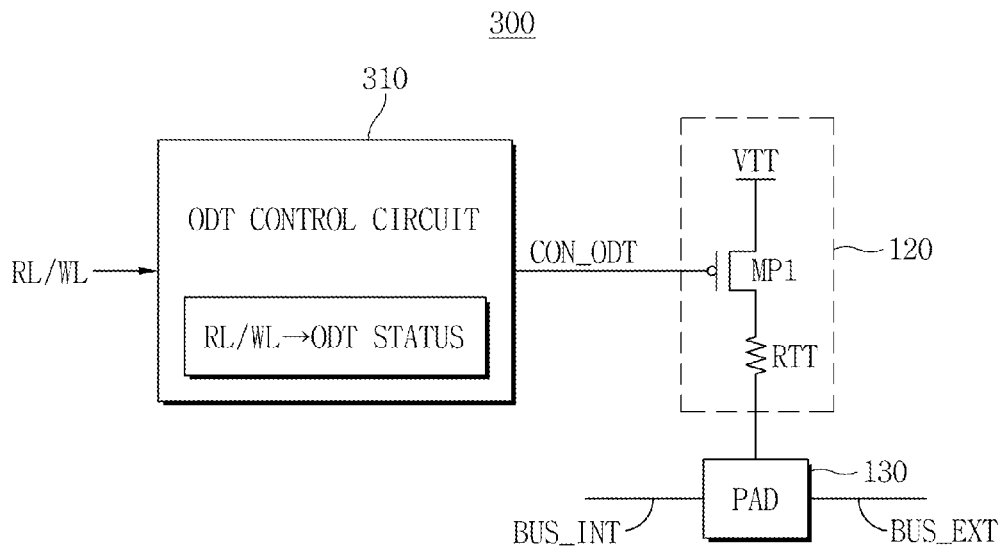
FIG. 3 is a circuit diagram of an ODT circuit in accordance with still another embodiment of the inventive concept.

FIG. 3 is a circuit diagram of an ODT circuit 300 in accordance with still another embodiment of the inventive concept. The ODT circuit 300 comprises an ODT control circuit 310 and an ODT section 120.

The ODT control circuit 310 determines an ODT status (ODT STATUS) based on a read latency control signal (RL) and a write latency control signal (WL) in order to generate an ODT control signal (CON_ODT). The ODT section 120 may be activated/deactivated in response to the ODT control signal CON_ODT. As will be described hereinafter, the read latency control signal (RL) may be generated based on a column address strobe (CAS) latency signal and a read information signal, and the write latency control signal (WL) may be generated based on the column address strobe (CAS) latency signal and a write information signal.

Figure 4:
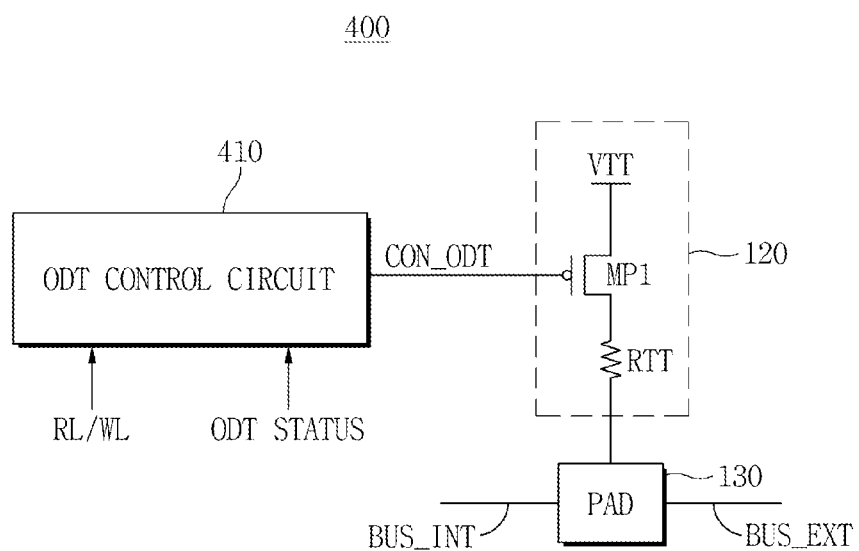
FIG. 4 is a circuit diagram of an ODT circuit in accordance with yet another embodiment of the inventive concept.

FIG. 4 is a circuit diagram of an ODT circuit 400 in accordance with yet another embodiment of the inventive concept. The ODT circuit 400 comprises an ODT control circuit 410 and an ODT section 120.

The ODT control circuit 410 generates an ODT control signal (CON_ODT) in response to a read latency control signal (RL), a write latency control signal (WL) and an ODT status signal (ODT STATUS). The ODT section 120 may be activated/deactivated in response to the ODT control signal CON_ODT. As will be described hereinafter, the read latency control signal (RL) may be generated based on a column address strobe (CAS) latency signal and a read information signal, and the write latency control signal (WL) may be generated based on the column address strobe (CAS) latency signal and a write information signal.

As will be described hereinafter, the ODT control circuit 410 may receive the read latency control signal RL, the write latency control signal WL, and the ODT status signal ODT STATUS from a register referred to as "mode register write (MRW) register". The values of the read latency control signal RL, the write latency control signal WL, and the ODT status signal and the ODT status signal stored in the MRW register may be updated by a user of a device incorporating a memory system consistent with an embodiment of the inventive concept.

The ODT circuits 200, 300 and 400 may be used to compensate for impedance mismatches associated with a bus in a memory system including at least one semiconductor memory devices in a manner similar to that of ODT circuit 100. That is, the ODT circuits 200, 300 and 400 may be respectively used to compensate for impedance mismatches associated with a data bus, a command/address (C/A) bus, and/or a command/address/data (C/A/D) bus in a memory system including one or more semiconductor memory devices.

FIG. 5 is a table listing exemplary values for a read latency control signal, a write latency control signal, and an ODT status that may be used in the ODT circuit of FIG. 4.

Referring to FIG. 5, when it is assumed in both first and second examples (EXAM. 1 and EXAM. 2) that when the values of RL and WL are 12 and 6 respectively, the ODT status signal OPX will have a value of 1, and accordingly, the ODT circuit 400 will be activated (ENABLE). In contrast, when it is assumed in the first example (EXAM. 1) that the values of RL and WL are 11 and 6 respectively, the ODT status signal OPX will have a value of 1, and accordingly, the ODT circuit 400 will be activated (ENABLE). However, when it is assumed in the second example (EXAM. 2) that the values of RL and WL are 11 and 6 respectively, the ODT status signal OPX will have a value of 0, and accordingly, the ODT circuit 400 will be deactivated (OFF).

Figure 6:
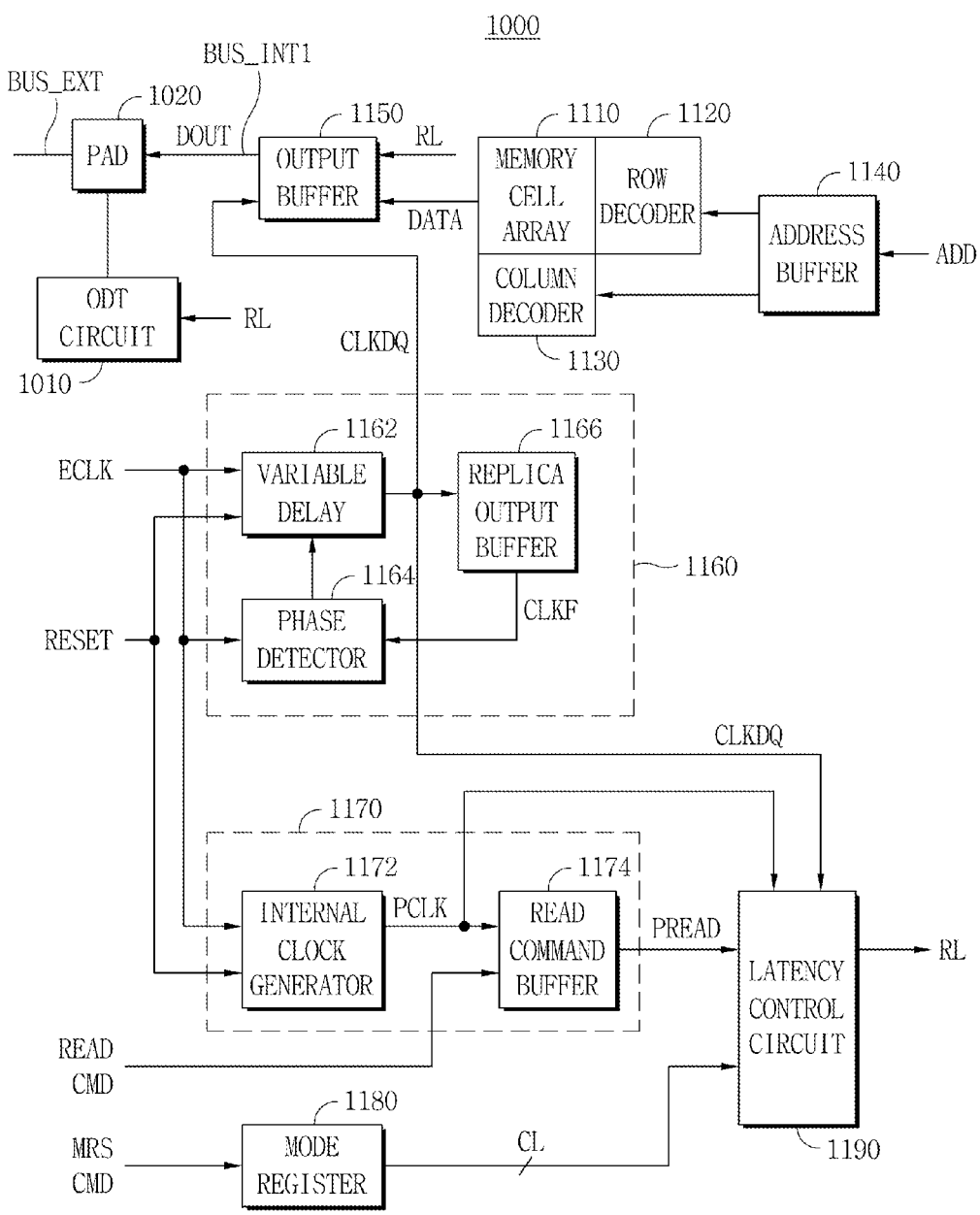
FIGS. 6, 7, 8 and 9 are respective block diagrams of semiconductor memory devices including an ODT circuit in accordance with various embodiments of the inventive concept.

FIG. 6 is a block diagram of a semiconductor memory device 1000 including an ODT circuit in accordance with embodiments of the inventive concept.

Referring to FIG. 6, the semiconductor memory device 1000 comprises a memory cell array 1110, a row decoder 1120, a column decoder 1130, an address buffer 1140, an output buffer 1150, a clock synchronizing circuit 1160, a read command circuit 1170, a mode register 1180, a latency control circuit 1190, an ODT circuit 1010 and a pad 1020.

The clock synchronizing circuit 1160 is a delay-locked-loop (DLL) circuit and may include a variable delay 1162, a phase detector 1164 and a replica output buffer 1166. The read command circuit 1170 may include an internal clock generator 1172 and a read command buffer 1174. The variable delay 1162 may be reset by a reset signal (RESET).

Data (DATA) may be written in the memory cell array 1110 or may be read from the memory cell array 1110 and output to an external circuit. When the read command (READ CMD) is applied to the semiconductor memory device 1000, the data (DATA) is read out of the memory cell array 1110 according to an externally applied address (ADD). The address buffer 1140 temporarily stores the address ADD received from the external circuit. The row decoder 1120 receives the address ADD from the address buffer 1140 and decodes the address ADD to generate a row address. The column decoder 1130 receives the address ADD from the address buffer 1140 and decodes the address ADD to generate a column address. The memory cell array 1110 outputs data from the memory cell defined by the row address and the column address. The output buffer 1150 receives data output from the memory cell array 1110, and outputs the received data in response to a read latency control signal RL output from the latency control circuit 1190 and an output clock signal (CLKDQ).

The clock synchronizing circuit 1160 generates the output clock signal CLKDQ in response to the external clock signal (ECLK). The external clock signal ECLK may be used as a reference clock signal for most commands in the semiconductor memory device 1000. That is, most of the commands may be synchronized with the external clock signal ECLK and applied to the semiconductor memory device 1000.

The clock synchronizing circuit 1160 generates the output clock signal CLKDQ that leads in phase compared with the external clock signal ECLK. That is, the output clock signal CLKDQ has the same frequency as the external clock signal ECLK, but pulses of the output clock signal CLKDQ lead in phase by a data output time (tSAC) compared with pulses of the external clock signal ECLK. Therefore, the clock synchronizing circuit 1160 synchronizes output data (DOUT) from the output buffer 1150 with the external clock signal ECLK.

The read command circuit 1170 generates the internal clock signal (PCLK) and the read information signal (PREAD) based on the read command READ CMD and the external clock signal ECLK. The internal clock generator 1172 generates the internal clock signal PCLK based on the external clock signal ECLK, and the read command buffer 1174 generates the read information signal PREAD based on the internal clock signal PCLK and the read command READ CMD. The internal clock generator 1172 may be reset by the reset signal RESET.

The latency control circuit 1190 receives the CAS latency (CL) from the mode register 1180, and generates the read latency control signal RL with which the output buffer 1150 outputs data at an appropriate time. The output buffer 1150 outputs data in response to the output clock signal CLKDQ when the read latency control signal RL is enabled.

The latency control circuit 1190 delays a read information signal according to a CAS latency signal and the internal clock signal PCLK to generate a delayed read information signal, and generates a read latency control signal RL based on the delayed read information signal.

The ODT circuit 1010 determines an ODT status based on a read latency control signal RL in order to generate an ODT control signal CON_ODT, and activates/deactivates the ODT section in response to the ODT control signal CON_ODT. The ODT circuit 1010 is connected to a pad 1020 that is electrically coupled between an external bus BUS_EXT and an internal bus BUS_INT1.

The semiconductor memory device 1000 of FIG. 6 may include a volatile memory chip such as a dynamic random access memory (DRAM) and a static random access memory (SRAM), a non-volatile memory chip such as a flash memory, a phase change memory, a magnetic random access memory (MRAM), or a resistive random access memory (RRAM), or a combination thereof.

Figure 7:
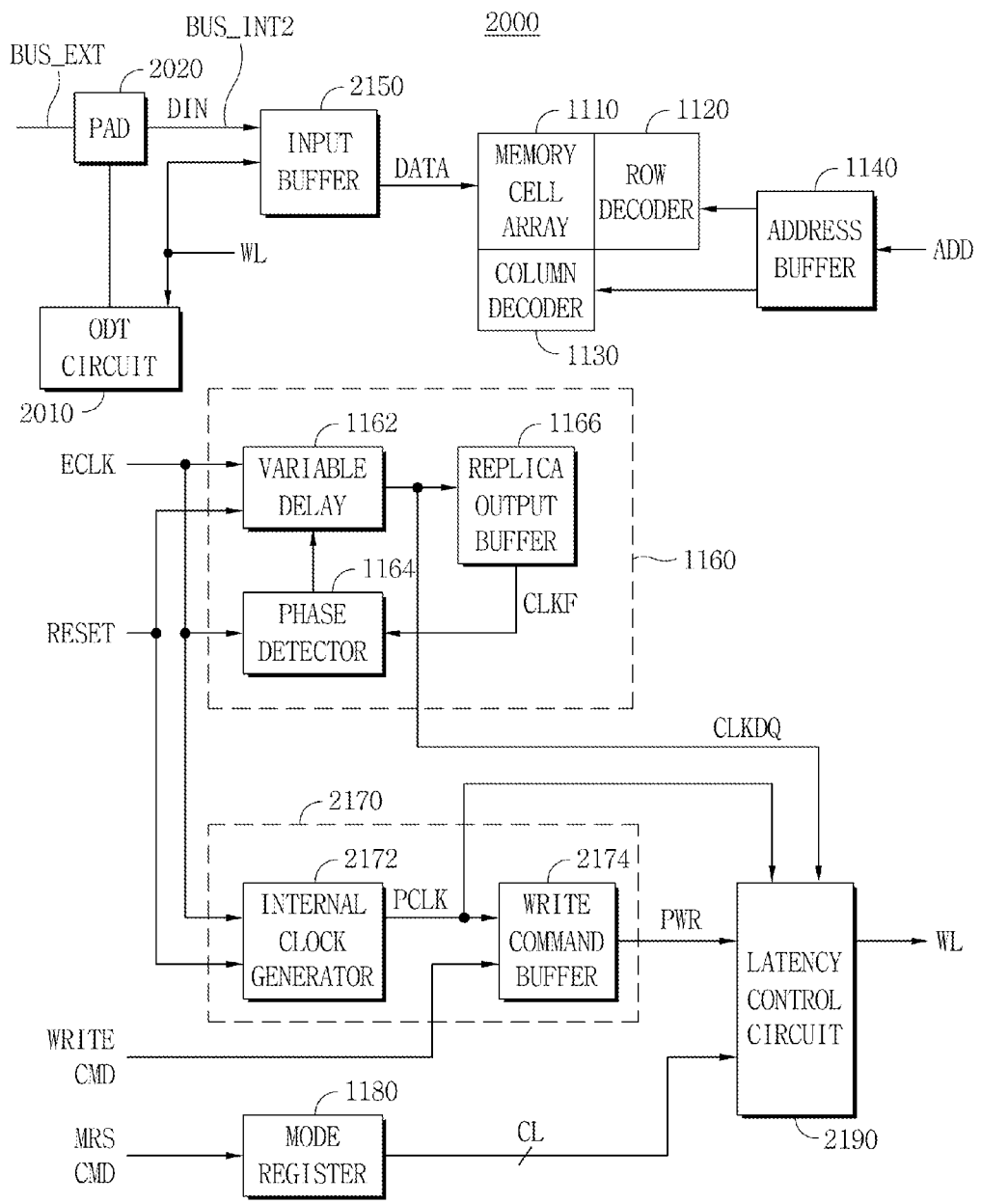

FIG. 7 is a block diagram of a semiconductor memory device 2000 including an ODT circuit in accordance with other embodiments of the inventive concept.

Referring to FIG. 7, the semiconductor memory device 2000 comprises a memory cell array 1110, a row decoder 1120, a column decoder 1130, an address buffer 1140, an input buffer 2150, a clock synchronizing circuit 1160, a write command circuit 2170, a mode register 1180, a latency control circuit 2190, an ODT circuit 2010 and a pad 2020.

The clock synchronizing circuit 1160 is a delay-locked-loop (DLL) circuit and may include a variable delay 1162, a phase detector 1164 and a replica output buffer 1166. The write command circuit 2170 may include an internal clock generator 2172 and a write command buffer 2174. The variable delay 1162 may be reset by a reset signal (RESET).

Data (DATA) may be written in the memory cell array 1110 or may be read from the memory cell array 1110 and output to an external circuit. When the write command (WRITE CMD) is applied to the semiconductor memory device 2000, the data is stored in the memory cell array 1110 according to an externally applied address (ADD). The address buffer 1140 temporarily stores the address ADD received from the external circuit. The row decoder 1120 receives the address ADD from the address buffer 1140 and decodes the address ADD to generate a row address. The column decoder 1130 receives the address ADD from the address buffer 1140 and decodes the address ADD to generate a column address. The memory cell array 1110 outputs data from the memory cell defined by the row address and the column address. The input buffer 2150 stores externally provide data (DATA) intended to be written to the memory cell array 1110 in response to a write latency control signal WL output from the latency control circuit 2190.

The clock synchronizing circuit 1160 generates the output clock signal (CLKDQ) in response to the external clock signal (ECLK). The external clock signal ECLK may be used as a reference clock signal for most commands in the semiconductor memory device 2000. That is, most of the commands may be synchronized with the external clock signal ECLK and applied to the semiconductor memory device 2000.

The clock synchronizing circuit 1160 generates the output clock signal CLKDQ that leads in phase compared with the external clock signal ECLK. That is, the output clock signal CLKDQ has the same frequency as the external clock signal ECLK, but pulses of the output clock signal CLKDQ lead in phase by a data output time tSAC compared with pulses of the external clock signal ECLK.

The write command circuit 2170 generates the internal clock signal (PCLK) and the write information signal (PWR) based on the write command WRITE CMD and the external clock signal ECLK. The internal clock generator 2172 generates the internal clock signal PCLK based on the external clock signal ECLK, and the write command buffer 2174 generates the write information signal PWR based on the internal clock signal PCLK and the write command WRITE CMD. The internal clock generator 2172 may be reset by the reset signal RESET.

The latency control circuit 2190 receives the CAS latency (CL) from the mode register 1180, and generates the write latency control signal WL with which the input buffer 2150 outputs data at an appropriate time. The input buffer 2150 inputs data when the write latency control signal WL is enabled.

The ODT circuit 2010 determines an ODT status based on the write latency control signal WL in order to generate the ODT control signal CON_ODT, and activate/deactivate the ODT section in response to the ODT control signal CON_ODT. The ODT circuit 2010 is connected to a pad 2020 that is electrically coupled between an external bus BUS_EXT and an internal bus BUS_INT2.

Figure 8:
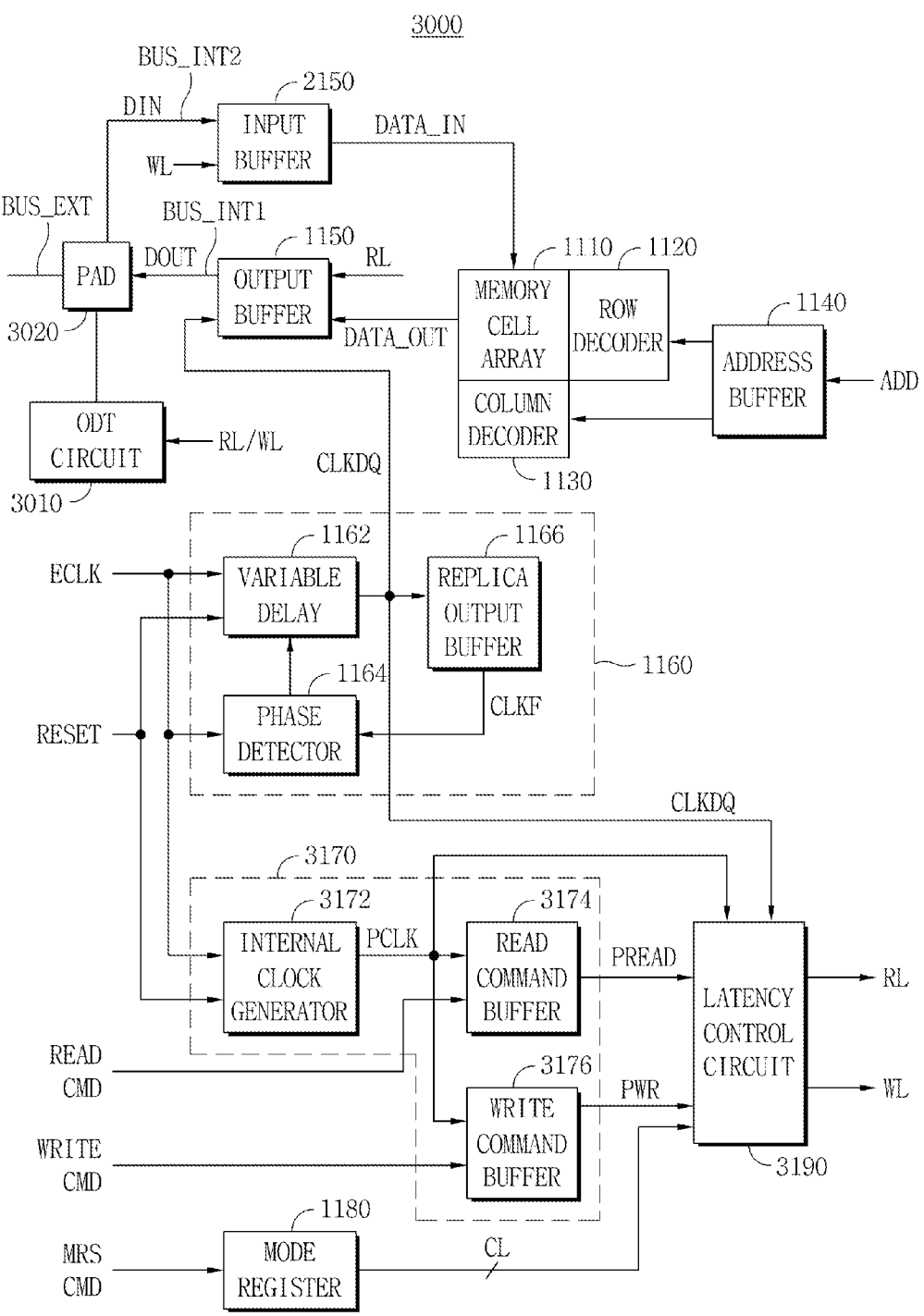

FIG. 8 is a block diagram of a semiconductor memory device 3000 including an ODT circuit in accordance with still other embodiments of the inventive concept.

Referring to FIG. 8, the semiconductor memory device 3000 comprises a memory cell array 1110, a row decoder 1120, a column decoder 1130, an address buffer 1140, an output buffer 1150, an input buffer 2150, a clock synchronizing circuit 1160, a command circuit 3170, a mode register 1180, a latency control circuit 3190, an ODT circuit 3010 and a pad 3020.

The clock synchronizing circuit 1160 is a delay-locked-loop (DLL) circuit and may include a variable delay 1162, a phase detector 1164 and a replica output buffer 1166. The command circuit 3170 may include an internal clock generator 3172, a read command buffer 3174 and a write command buffer 3176. The variable delay 1162 may be reset by a reset signal (RESET).

Data (DATA) may be written in the memory cell array 1110 or may be read from the memory cell array 1110 and output to an external circuit. When the read command (READ CMD) is applied to the semiconductor memory device 3000, the output data (DATA_OUT) is read from the memory cell array 1110 according to an address ADD received from the external circuit. When the write command (WRITE CMD) is applied to the semiconductor memory device 3000, the input data (DATA_IN) is stored in the memory cell array 1110 according to an externally provided address (ADD). The address buffer 1140 temporarily stores the address ADD received from the external circuit. The row decoder 1120 receives the address ADD from the address buffer 1140 and decodes the address ADD to generate a row address. The column decoder 1130 receives the address ADD from the address buffer 1140 and decodes the address ADD to generate a column address. The memory cell array 1110 outputs data from the memory cell defined by the row address and the column address. The output buffer 1150 receives data output from the memory cell array 1110, and outputs the received data in response to a read latency control signal (RL) output from the latency control circuit 3190 and an output clock signal (CLKDQ). The input buffer 2150 stores externally provided input data DATA_IN in the memory cell array 1110 in response to a write latency control signal WL output from the latency control circuit 3190.

The clock synchronizing circuit 1160 generates the output clock signal CLKDQ in response to the external clock signal ECLK. The external clock signal ECLK may be used as a reference clock signal for most commands in the semiconductor memory device 1000. That is, most of the commands may be synchronized with the external clock signal ECLK and applied to the semiconductor memory device 3000.

The clock synchronizing circuit 1160 generates the output clock signal CLKDQ that leads in phase compared with the external clock signal ECLK. That is, the output clock signal CLKDQ has the same frequency as the external clock signal ECLK, but pulses of the output clock signal CLKDQ lead in phase by a data output time tSAC compared with pulses of the external clock signal ECLK. Therefore, the clock synchronizing circuit 1160 synchronizes data DOUT output from the output buffer 1150 with the external clock signal ECLK.

The read command circuit 3170 generates the internal clock signal (PCLK), the read information signal (PREAD) and the write information signal (PWR) based on the read command READ CMD, the write command WRITE CMD and the external clock signal ECLK. The internal clock generator 3172 generates the internal clock signal PCLK based on the external clock signal ECLK, the read command buffer 3174 generates the read information signal PREAD based on the internal clock signal PCLK and the read command READ CMD, and the write command buffer 3176 generates the write information signal PWR based on the internal clock signal PCLK and the write command WRITE CMD. The internal clock generator 3172 may be reset by the reset signal RESET.

The latency control circuit 3190 receives the CAS latency (CL) from the mode register 1180, and generates the read latency control signal RL and the write latency control signal WL. The output buffer 1150 outputs data in response to the output clock signal CLKDQ while the read latency control signal RL is enabled. The input buffer 2150 inputs data while the write latency control signal WL is enabled.

The latency control circuit 3190 delays a read information signal according to a CAS latency signal and the internal clock signal PCLK to generate a delayed read information signal, and generates a read latency control signal RL based on the delayed read information signal. Further, the latency control circuit 3190 delays a write information signal according to a CAS latency signal and the internal clock signal PCLK to generate a delayed write information signal, and generates a write latency control signal WL based on the delayed write information signal.

The ODT circuit 3010 determines an ODT status based on the read latency control signal RL and write latency control signal WL in order to generate an ODT control signal CON_ODT, and activate/deactivate the ODT section in response to the ODT control signal CON_ODT. The ODT circuit 3010 may be connected to a pad 3020 that is electrically coupled between an external bus BUS_EXT and internal buses BUS_INT1 and BUS_INT2.

Figure 9:
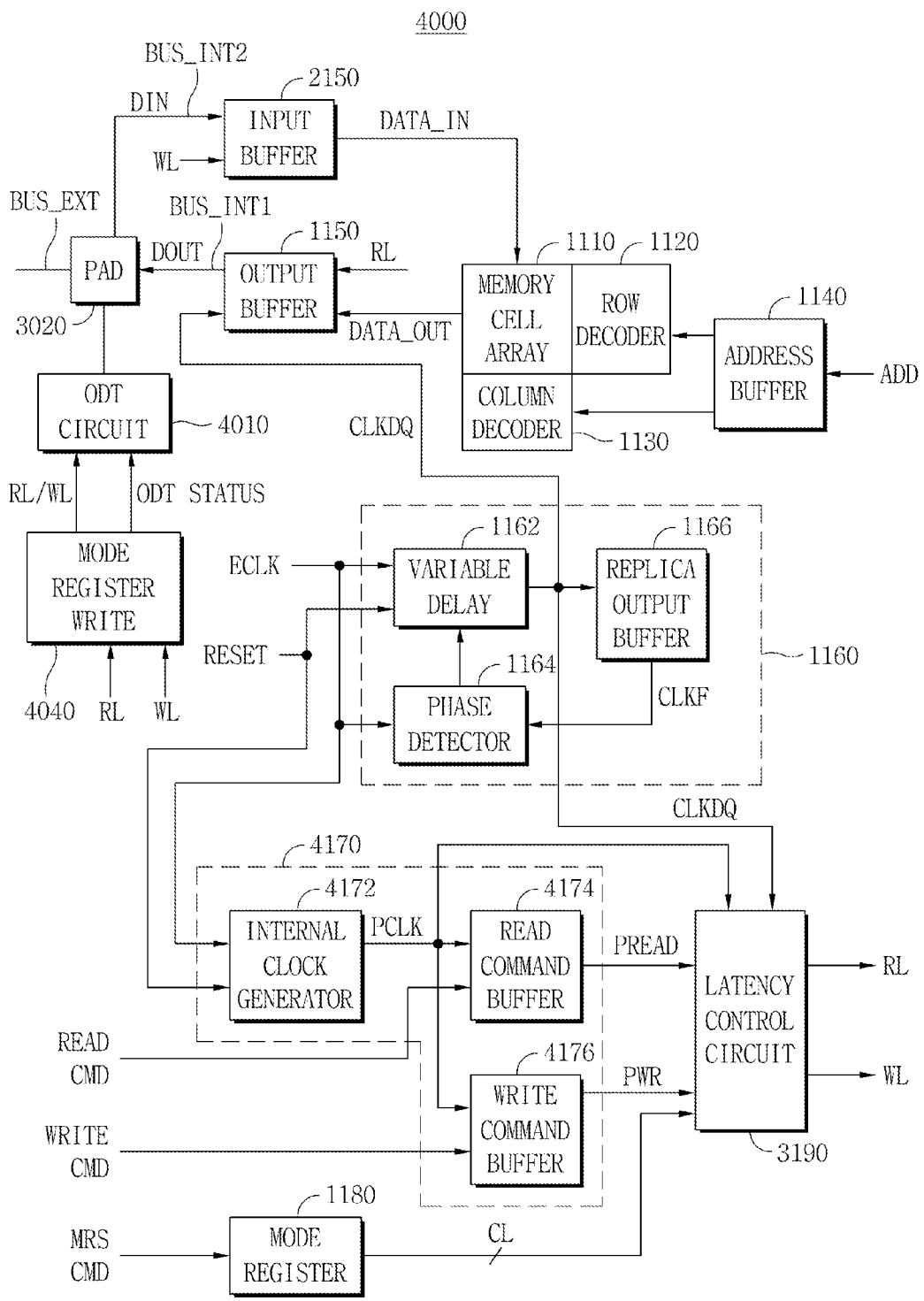

FIG. 9 is a block diagram of a semiconductor memory device 4000 including an ODT circuit in accordance with yet other embodiments of the inventive concept.

Referring to FIG. 9, the semiconductor memory device 3000 comprises a memory cell array 1110, a row decoder 1120, a column decoder 1130, an address buffer 1140, an output buffer 1150, an input buffer 2150, a clock synchronizing circuit 1160, a command circuit 3170, a mode register 1180, a latency control circuit 3190, an on-die termination (ODT) circuit 4010, a mode register write (MRW) register 4040 and a pad 3020.

The ODT circuit 4010 generates an ODT control signal CON_ODT based on the read latency control signal RL, the write latency control signal WL and the ODT status signal ODT STATUS, and activates or inactivates the ODT section in response to the ODT control signal. The ODT circuit 4010 may be connected to a pad 3020 that is electrically coupled between an external bus BUS_EXT and internal buses BUS_INT1 and BUS_INT2.

The ODT circuit 4010 may receive the read latency control signal RL, the write latency control signal WL and the ODT status signal ODT STATUS from a register that is called a mode register write MRW. Further, the values of the read latency control signal RL, the write latency control signal WL and the ODT status signal stored in the MRW register may be updated by a user.

Figure 10:
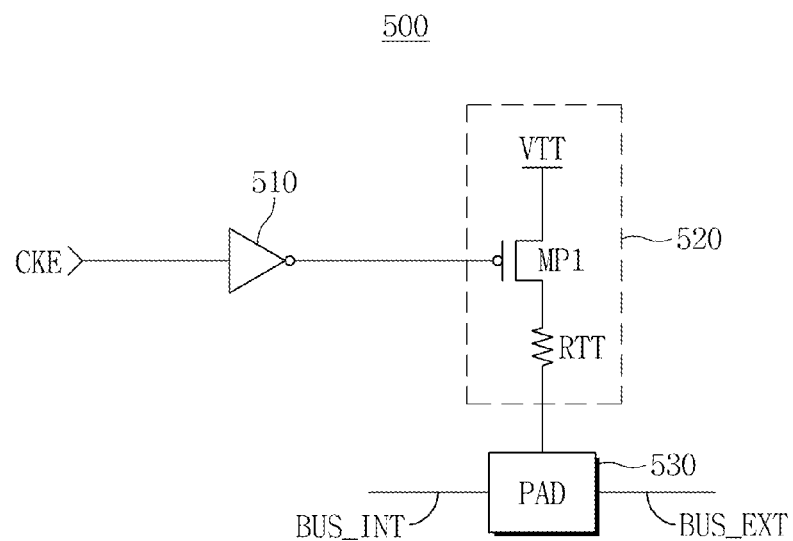
FIGS. 10, 11, 12 and 13 are respective circuit diagrams of an ODT circuit in accordance with certain embodiment of the inventive concept.

FIG. 10 is a circuit diagram of an ODT circuit 500 in accordance with yet another embodiment of the inventive concept. The ODT circuit 500 comprises an inverter 510, an ODT section 520, and an output pad 530.

The inverter 510 inverts the phase of an applied clock enable signal (CKE). The ODT section 520 is electrically connected to the output pad 530, and may be activated/deactivated in response to the output signal of the inverter 510. The clock enable signal CKE may be received from a memory controller (not shown). During a power-down mode, the clock enable signal CKE is disabled.

An external bus BUS_EXT and an internal bus BUS_INT may be electrically coupled through the output pad 530, wherein the external bus BUS_EXT may be a command/address (C/A) bus, a data (DQ) bus, or a command/address/data (C/A/D) bus.

The ODT section 520 includes a PMOS transistor MP1 and a termination resistor RTT. The PMOS transistor MP1 may be turned ON/OFF in response to the output signal of the inverter 510, and the termination resistor RTT is connected between the PMOS transistor MP1 and the output pad 530. A termination supply voltage VTT may be applied to a source of the PMOS transistor MP1.

The ODT circuit 500 may be used to compensate for impedance mismatches associated with a data bus (DQ), a command/address (C/A) bus, and/or a command/address/data (C/A/D) bus in a memory system including at least one semiconductor memory device.

Figure 11:
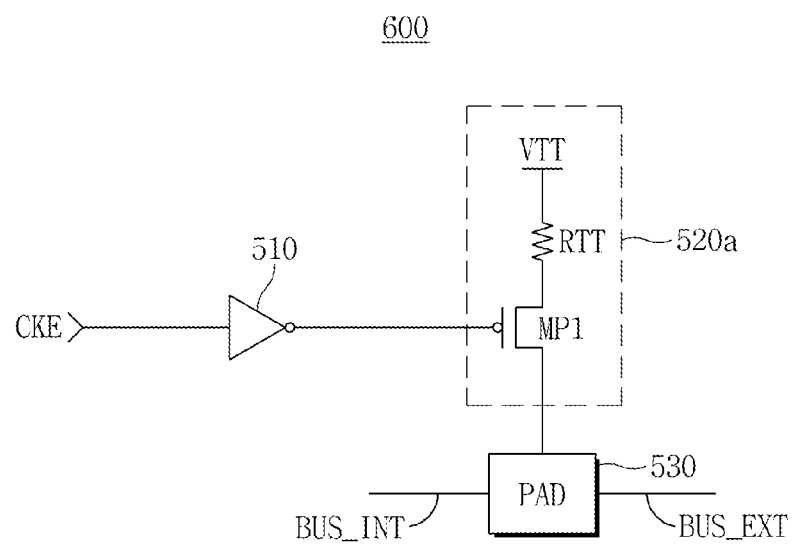

FIG. 11 is a circuit diagram of an ODT circuit 600 in accordance with yet another embodiment of the inventive concept. The ODT circuit 600 comprises an ODT section 520a including the termination resistor RTT coupled between the termination supply voltage VTT and the PMOS transistor MP1. The ODT circuit 600 of FIG. 11 operates similarly to the ODT circuit 500 of FIG. 10.

The ODT circuit 600 may be used to compensate for impedance mismatches associated with a data bus (DQ), a command/address (C/A) bus, and/or a command/address/data (C/A/D) bus in a memory system including at least one semiconductor memory device.

Figure 12:
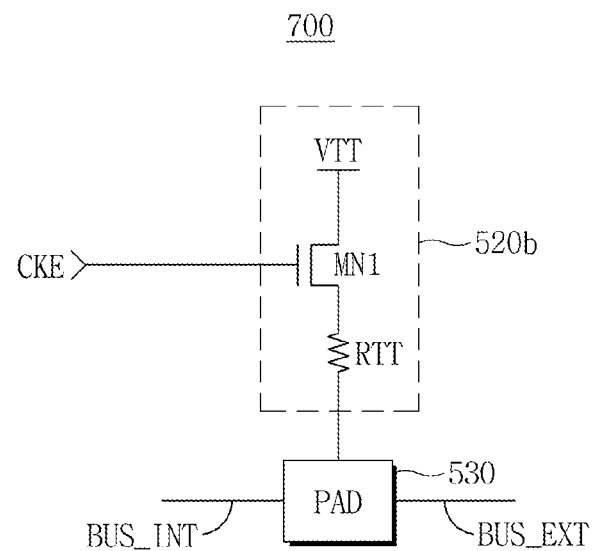

FIG. 12 is a circuit diagram of an ODT circuit 700 in accordance with yet another embodiment of the inventive concept. The ODT circuit 700 comprises an ODT section 520b and an output pad 530.

The ODT section 520b is electrically connected to the output pad 530, and may be activated/deactivated in response to a clock enable signal CKE. The clock enable signal CKE may be received from a memory controller (not shown). During a power-down mode, the clock enable signal CKE will be disabled.

An external bus BUS_EXT and an internal bus BUS_INT may be electrically coupled through the output pad 530, wherein the external bus BUS_EXT may be a command/address (C/A) bus, a data (DQ) bus, or a command/address/data (C/A/D) bus in a memory system including at least one semiconductor memory device.

The ODT section 520b includes an NMOS transistor MN1 that is turned ON/OFF in response to the clock enable signal CKE, and a termination resistor RTT that is connected between the NMOS transistor MN1 and the output pad 530. A termination supply voltage VTT may be applied to a drain of the NMOS transistor MN1.

Figure 13:
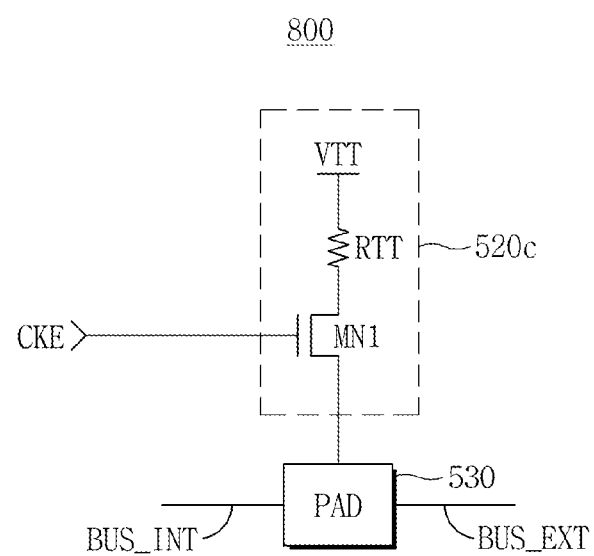

FIG. 13 is a circuit diagram of an ODT circuit 800 in accordance with yet another embodiment of the inventive concept. The ODT circuit 800 comprises an ODT section 520c including the termination resistor RTT coupled between the termination supply voltage VTT and the NMOS transistor MN1. The ODT circuit 800 of FIG. 13 operates similarly to the ODT circuit 700 of FIG. 12.

The ODT circuit 800 may be used to compensate for impedance mismatches associated with a data bus (DQ), a command/address (C/A) bus, and/or a command/address/data (C/A/D) bus in a memory system including at least one semiconductor memory device.

Figure 14:
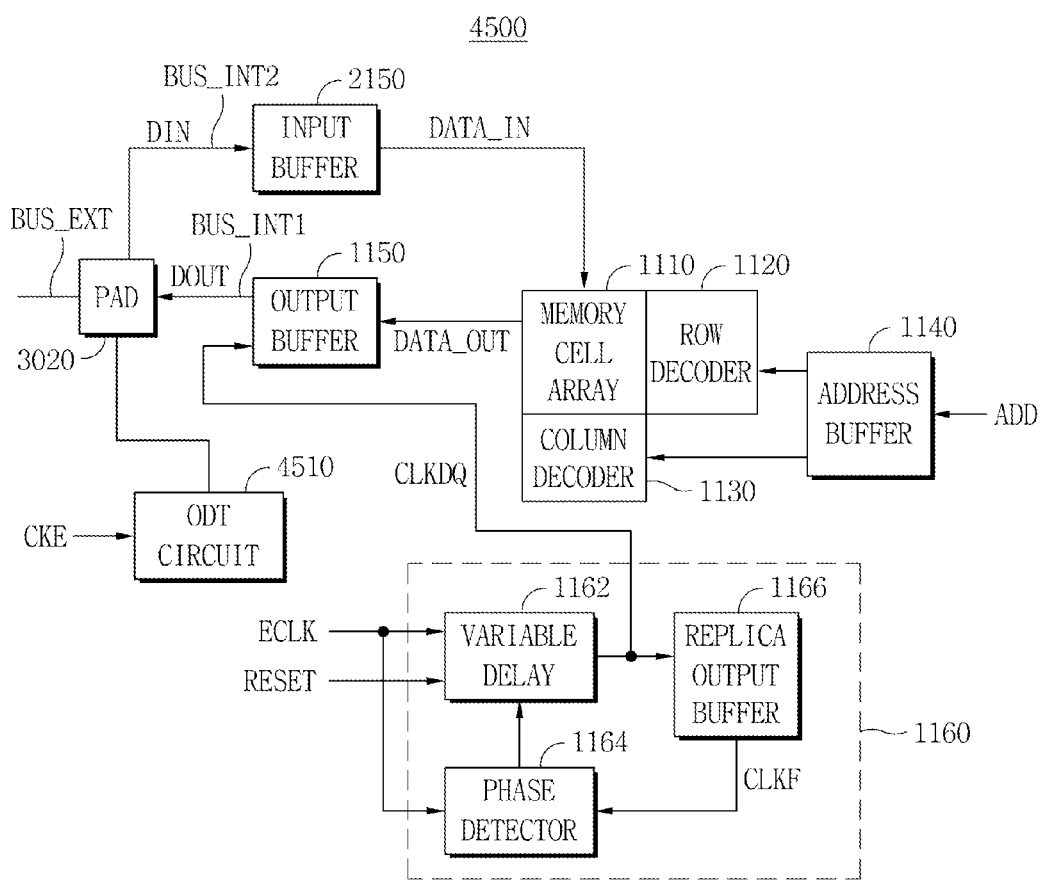
FIG. 14 is a block diagram of a semiconductor memory device including an ODT circuit in accordance with an embodiment of the inventive concept.

FIG. 14 is a block diagram of a semiconductor memory device 4500 including an ODT circuit in accordance with still other embodiments of the inventive concept.

Referring to FIG. 14, the semiconductor memory device 4500 comprises a memory cell array 1110, a row decoder 1120, a column decoder 1130, an address buffer 1140, an output buffer 1150, an input buffer 2150, a clock synchronizing circuit 1160, an ODT circuit 4510 and a pad 3020.

The ODT circuit 4510 activates/deactivates a termination resistor in response to the clock enable signal CKE. The ODT circuit 4510 may be electrically connected to the pad 3020.

The clock synchronizing circuit 1160 is a delay-locked-loop (DLL) circuit and may include a variable delay 1162, a phase detector 1164 and a replica output buffer 1166. The variable delay 1162 may be reset by a reset signal (RESET).

Data (DATA) may be written in the memory cell array 1110 or may be read from the memory cell array 1110 and output to an external circuit. When the read command READ CMD is applied to the semiconductor memory device 4500, the data (DATA) is read from the memory cell array 1110 according to an address (ADD) received from the external circuit. The address buffer 1140 temporarily stores the address ADD received from the external circuit. The row decoder 1120 receives the address ADD from the address buffer 1140 and decodes the address ADD to generate a row address. The column decoder 1130 receives the address ADD from the address buffer 1140 and decodes the address ADD to generate a column address. The memory cell array 1110 outputs data from the memory cell defined by the row address and the column address. The output buffer 1150 receives data (DATA_OUT) output from the memory cell array 1110, and outputs the received data in response to an output clock signal (CLKDQ). The output data (DOUT) is output through the pad 3020. The input buffer 2150 buffers input data (DIN) received from the pad 3020 to generate data (DATA_IN) and stores data in the memory cell array 1110.

The semiconductor memory device 4500 of FIG. 14 may include a volatile memory chip such as a dynamic random access memory (DRAM) and a static random access memory (SRAM), a non-volatile memory chip such as a flash memory, a phase change memory, a magnetic random access memory (MRAM), or a resistive random access memory (RRAM), or a combination thereof.

Figure 15:
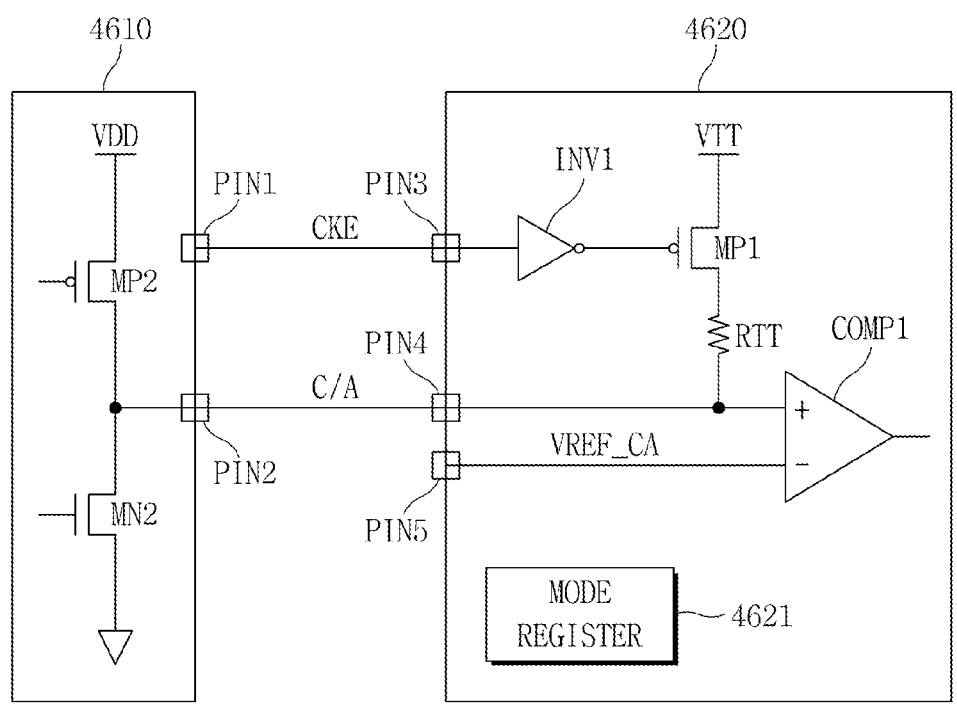
FIGS. 15, 16 and 17 are respective circuit diagram of memory systems in accordance with various embodiments of the inventive concept.

FIG. 15 is a circuit diagram illustrating a memory system 4600 in accordance with an embodiment of the inventive concept. The memory system 4600 generally comprises a memory controller 4610 and a semiconductor memory device 4620. FIG. 15 is provide as a further specific example of performing on-die termination in relation to a command/address (C/A) bus.

In FIG. 15, the semiconductor memory device 4620 includes at least one of the ODT circuits described above in relation to FIGS. 10 through 13. The semiconductor memory device 4620 may include an inverter INV1, a PMOS transistor MP1, a termination resistor RTT, a comparator COMP1 and pins PIN3, PIN4 and PIN5. The ODT circuit including the inverter INV1, the PMOS transistor MP1 and the termination resistor RTT may operate in the similar way to that of the ODT circuit of FIG. 10. The comparator COMP1 compares a command/address (C/A) received from the memory controller 4610 through the pin PIN4 with a reference voltage VREF_CA, and amplifies the comparison result to generate an internal command/address. The memory controller 4610 may include pins PIN1 and PIN2. PIN1 and PIN3 are connected to a CKE bus and PIN2 and PIN4 are connected to a C/A bus. A PMOS transistor MP2 and an NMOS transistor MN2 included in the memory controller 4610 may comprise a part of a circuit that outputs the command/address (C/A).

In certain conventional semiconductor memory devices, a problem arises in that a current path may form from the termination supply voltage VTT through PIN4 to the NMOS transistor MN2 of the memory controller 4610, because the termination supply voltage VTT is supplied during a power-down mode in which the ODT circuit does not need to operate. Note again that during the power-down mode, the clock enable signal CKE is disabled.

Thus, during the power-down mode, the semiconductor memory device 4620 turns OFF the PMOS transistor MP1 in response to the clock enable signal CKE, and thereby deactivates the termination resistor RTT. Accordingly, during the power-down mode, the semiconductor memory device 4620 may not form a current path from the termination supply voltage VTT through PIN4 to the NMOS transistor MN2 of the memory controller 4610.

Further, in the memory system of FIG. 15, the system may determine whether a method of deactivating the ODT circuit using the clock enable signal CKE should be used or not by referencing stored values in the mode register 4621 of the semiconductor memory device 4620.

Figure 16:
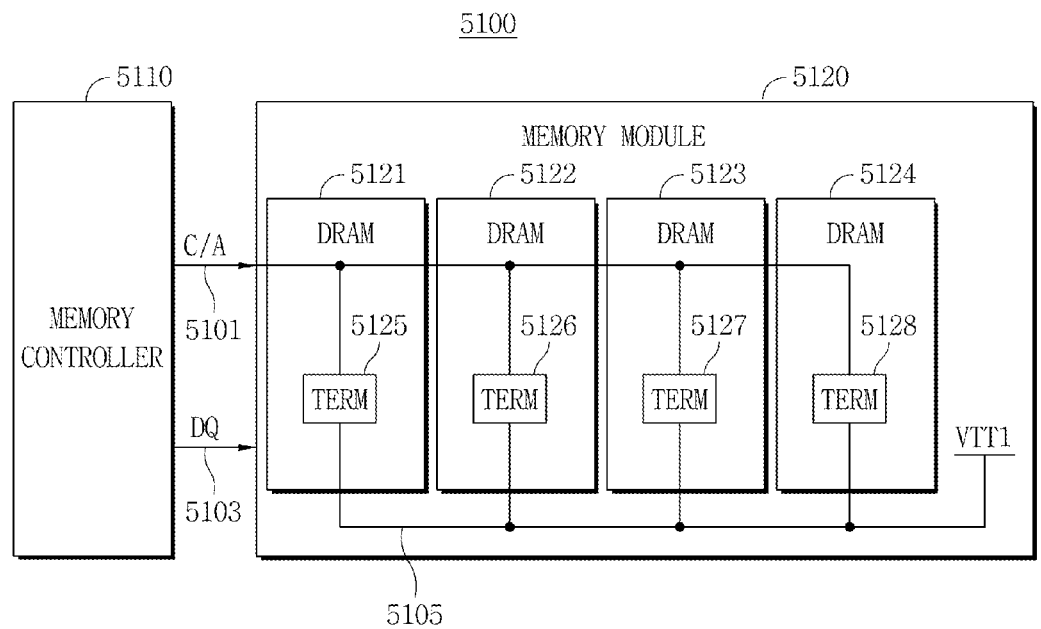

FIG. 16 is a circuit diagram of a memory system 5100 in accordance with another embodiment of the inventive concept. The memory system 5100 generally comprises a memory controller 5110 and a memory module 5120.

The memory controller 5110 generates a command/address signal C/A and a data signal DQ. The memory module 5120 operates in response to the command/address signal C/A and the data signal DQ. A plurality of semiconductor memory devices 5121, 5122, 5123 and 5124 are mounted on the memory module 5120. Each of the semiconductor memory devices 5121, 5122, 5123 and 5124 has a termination circuit 5125, 5126, 5127 or 5128 for a command/address bus 5101 through which the command/address signal C/A is transmitted. The command/address signal C/A may be a packet data in which a command signal and an address signal are coupled in a packet form.

The memory module 5120 having four (4) semiconductor memory devices is shown in FIG. 16, but the memory module 5120 may have two semiconductor memory devices or more. Further, semiconductor memory devices may be mounted on both sides of a substrate of the memory module 5120.

The data signal DQ is transmitted or received between the memory controller 5110 and the semiconductor memory devices 5121, 5122, 5123 and 5124 constituting the memory module 5120 through a data bus 5103.

The command/address bus 5101 has a so-called "fly-by structure", and electrically connects the semiconductor memory devices 5121, 5122, 5123 and 5124 to each other. Further, each of the termination circuit 5125, 5126, 5127 and 5128 included in each of the semiconductor memory devices 5121, 5122, 5123 and 5124 is coupled between the command/address bus 5101 and a termination voltage VTT, and changes a termination resistance of the command/address bus 5101.

Figure 17:
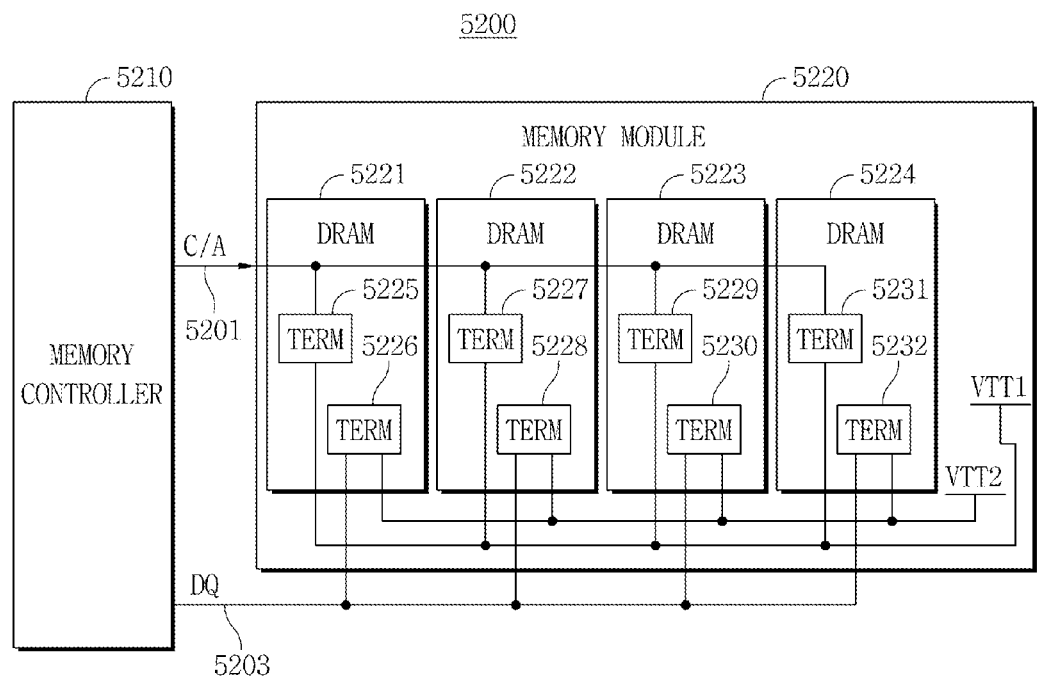

FIG. 17 is a block diagram of a memory system 5200 in accordance with still another embodiment of the inventive concept. The memory system 5200 generally comprises a memory controller 5210 and a memory module 5220.

The memory controller 5210 generates a command/address signal C/A and a data signal DQ. The memory module 5220 operates in response to the command/address signal C/A and the data signal DQ. A plurality of semiconductor memory devices 5221, 5222, 5223 and 5224 are mounted on the memory module 5220. Each of the semiconductor memory devices 5221, 5222, 5223 and 5224 has a termination circuit 5225, 5227, 5229 or 5231 for a command/address bus 5201 through which the command/address signal C/A is transmitted. The command/address signal C/A may be a packet data in which a command signal and an address signal are coupled in a packet form. Further, each of the semiconductor memory devices 5221, 5222, 5223 and 5224 includes a termination circuit 5226, 5228, 5230 or 5232 for a data bus 5203 through which a data signal DQ is transmitted.

The memory module 5220 having four (4) semiconductor memory devices is shown in FIG. 17, but the memory module 5220 may have two semiconductor memory devices or more. Further, semiconductor memory devices may be mounted on both sides of a substrate of the memory module 5220.

The data signal DQ is transmitted or received between the memory controller 5210 and the semiconductor memory devices 5221, 5222, 5223 and 5224 constituting the memory module 5220 through a data bus 5203.

The command/address bus 5201 has the fly-by structure, and electrically connects the semiconductor memory devices 5221, 5222, 5223 and 5224 to each other. Further, each of the termination circuit 5225, 5227, 5229 and 5231 included in each of the semiconductor memory devices 5221, 5222, 5223 and 5224 is coupled between the command/address bus 5201 and a first termination voltage VTT1, and changes a termination resistance of the command/address bus 5201. Further, each of the termination circuit 5226, 5228, 5230 and 5232 included in each of the semiconductor memory devices 5221, 5222, 5223 and 5224 is coupled between the data bus 5203 and a second termination voltage VTT2, and changes a termination resistance of the data bus 5203.

The first termination voltage VTT1 is provided to each of the termination circuits 5225, 5227, 5229 and 5231, and the second termination voltage VTT2 is provided to each of the termination circuits 5226, 5228, 5230 and 5232.

Figure 18:
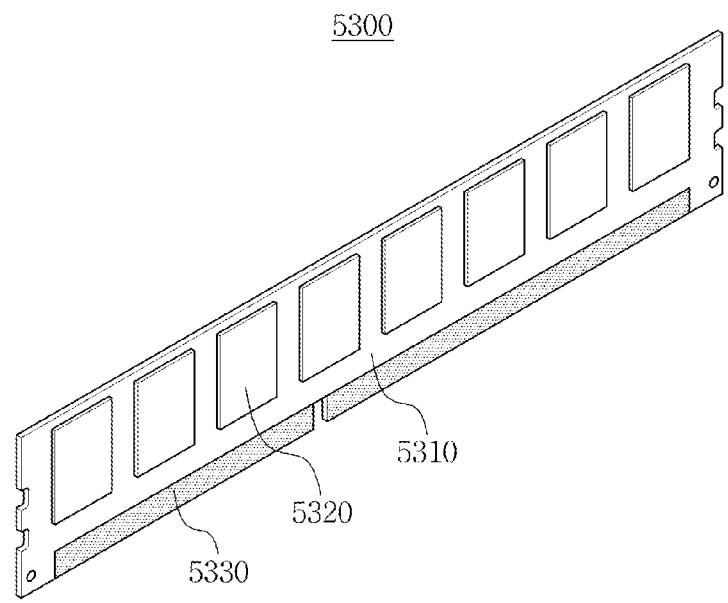
FIGS. 18, 19 and 20 are respective diagrams illustrating memory modules including at least one semiconductor memory device in accordance with embodiments of the inventive concept.
Figure 19:
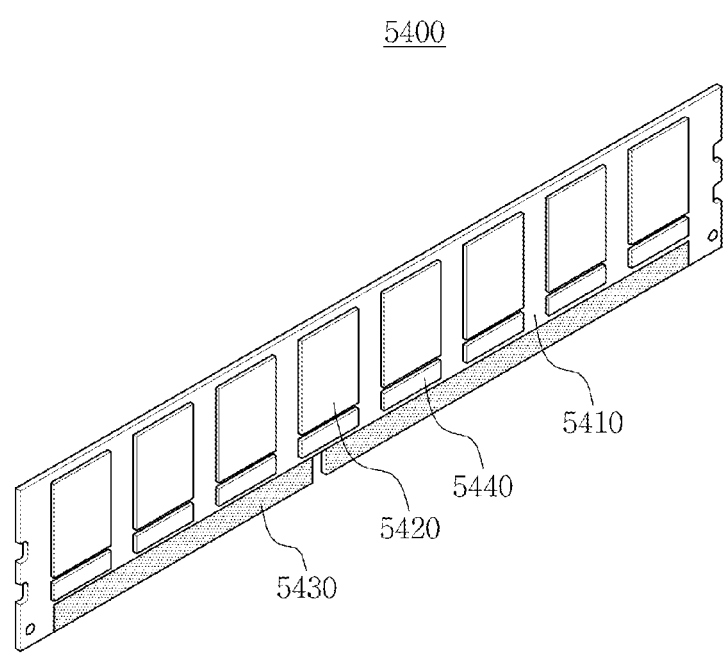
Figure 20:
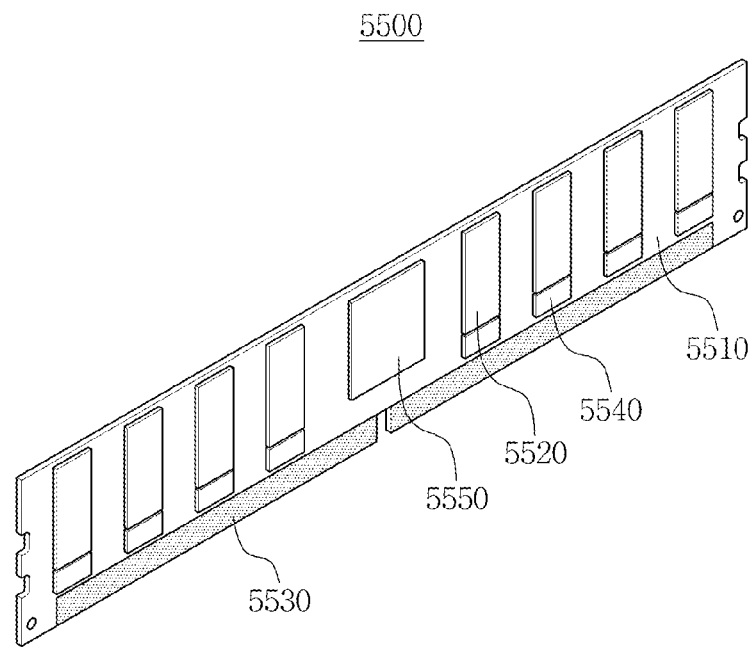

FIGS. 18, 19 and 20 are respective diagrams illustrating memory modules including a semiconductor memory device in accordance with embodiments of the inventive concept.

Referring to FIG. 18, the memory module 5300 may include a printed circuit board (PCB) 5310, a plurality of semiconductor memory devices 5320, and a connector 5330. The plurality of semiconductor memory devices 5320 may be bonded to top and bottom surfaces of the PCB 5310. The connector 5330 may be electrically connected to the plurality of semiconductor memory devices 5320 through conductive lines (not shown). Also, the connector 5330 may be connected to a slot of an external host.

Referring to FIG. 19, the memory module 5400 may include a PCB 5410, a plurality of semiconductor memory devices 5420, a connector 5430, and a plurality of buffers 5440. Each of the plurality of buffers 5440 may be disposed between the corresponding one of the semiconductor memory devices 5420 and the connector 5430.

The semiconductor memory devices 5420 and the buffers 5440 may be provided on top and bottom surfaces of the PCB 5410. The semiconductor memory devices 5420 and the buffers 5440 formed on the top and bottom surfaces of the PCB 5410 may be connected through a plurality of via holes.

Referring to FIG. 20, the memory module 5500 may include a PCB 5510, a plurality of semiconductor memory devices 5520, a connector 5530, a plurality of buffers 5540, and a controller 5550.

The semiconductor memory devices 5520 and the buffers 5540 may be provided on top and bottom surfaces of the PCB 5510. The semiconductor memory devices 5520 and the buffers 5540 formed on the top and bottom surfaces of the PCB 5510 may be connected through a plurality of via holes.

Figure 21:
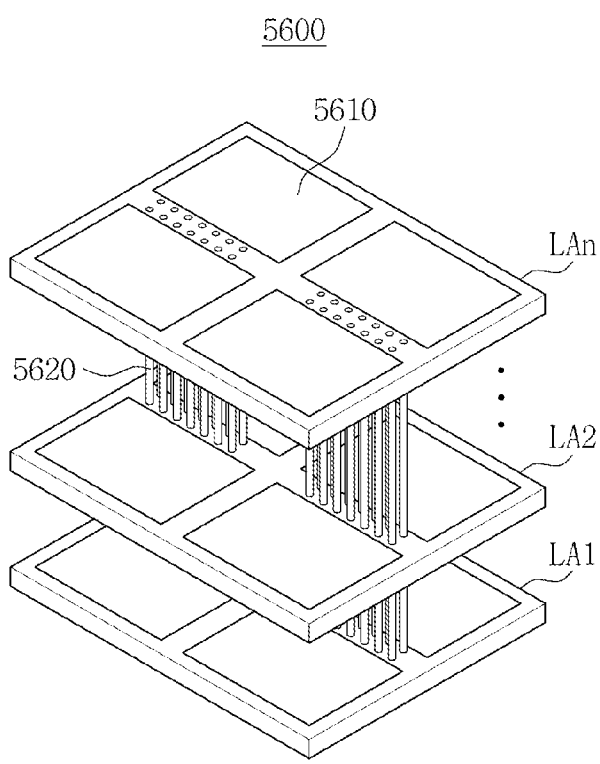
FIG. 21 is a perspective diagram illustrating a stacked semiconductor device including at least one semiconductor memory device in accordance with embodiments of the inventive concept.

FIG. 21 is a perspective view illustrating one example of a stacked semiconductor device 5600 including at least one semiconductor memory device in accordance with embodiments of the inventive concept. In the memory modules of FIGS. 18 to 20, each of the semiconductor memory devices may include a plurality of semiconductor layers LA1 to LAn.

In the stacked semiconductor device 5600, the plurality of stacked semiconductor layers LA1 to LAn may be connected to one another through through-silicon vias (TSVs) 5620.

Figure 22:
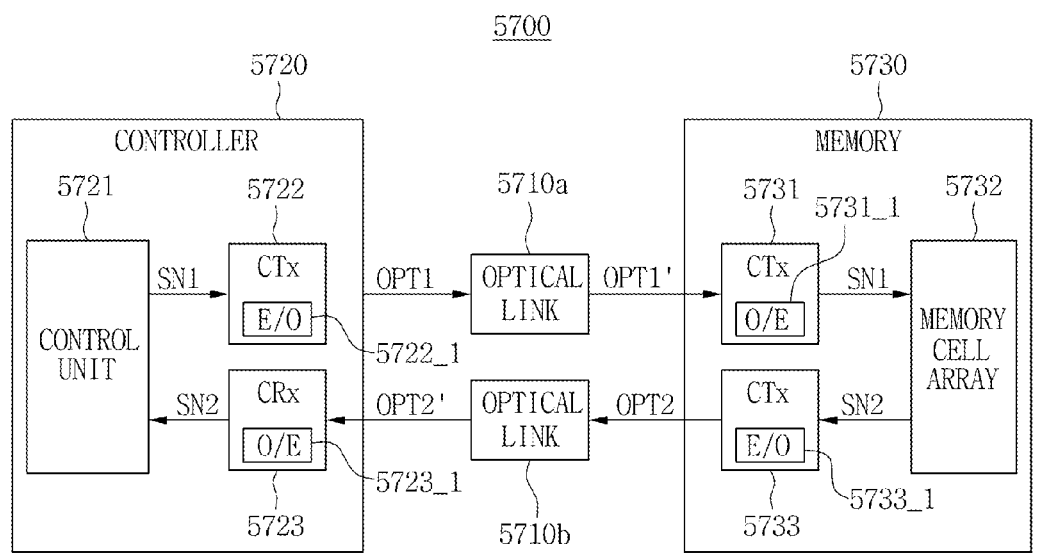
FIG. 22 is a block diagram of a memory system including at least one semiconductor memory device configured with an optical connection according to embodiments of the inventive concept.

FIG. 22 is a block diagram illustrating a memory system 5700 including at least one semiconductor memory device configured with an optical connection according to embodiments of the inventive concept.

Referring to FIG. 22, the memory system 5700 may include a controller 5720, a semiconductor memory device 5730, and a plurality of optical links 5710*a* and 5710*b* configured to interconnect the controller 5720 and the semiconductor memory device 5730. The controller 5720 may include a control unit 5721, a first transmitter 5722, and a first receiver 5723. The control unit 5721 may transmit a control signal SN1 to the first transmitter 4622.

The first transmitter 5722 may include a first optical modulator 5722_1, which may convert the control signal SN1, which is an electric signal, into a first optical transmission signal OPT1, and transmit the first optical transmission signal OPT1 to the optical link 5710*a*.

The first receiver 5723 may include a first optical demodulator 5723_1, which may convert a second optical receiving signal OPT2' received from the optical link 5710*b* into a data signal SN2, which is an electric signal, and transmit the data signal SN2 to the control unit 5721.

The MRAM device 5730 may include a second receiver 5731, a memory cell array 5732, and a second transmitter 5733. The second receiver 5731 may include a second optical modulator 5731_1, which may convert a first optical receiving signal OPT1' received from the optical link 5710A into the control signal SN1, which is the electric signal, and transmit the control signal SN1 to the memory cell array 5732.

In the memory cell array 5732, data may be written under the control of the control signal SN1, or the data signal SN2 output from the memory cell array 5732 may be transmitted to the second transmitter 5733.

The second transmitter 5733 may include a second optical modulator 5733_1, which may convert the data signal SN2, which is the electric signal, into a second optical data signal OPT2, and transmit the second optical data signal OPT2 to the optical link 5710b.

Figure 23:
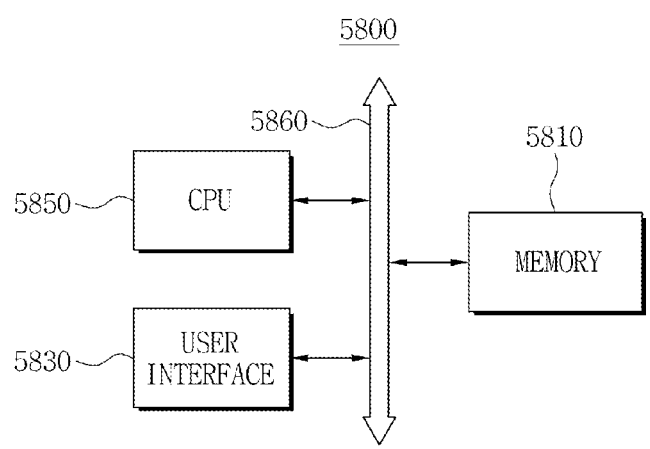
FIG. 23 is a general block diagram of an information processing system including at least one semiconductor memory device according to certain embodiments of the inventive concept.

FIG. 23 is a block diagram illustrating a computational system including at least one semiconductor memory device according to embodiments of the inventive concept.

Referring to FIG. 23, a semiconductor memory device 5810 may be mounted in a computational system 5800, such as a mobile device or a desktop computer. The computational system 5800 may include a semiconductor memory device 5810, a CPU 5850, and a user interface 5830, which may be electrically connected to a system bus 5860.

Embodiments of the inventive concept may be applied to a semiconductor device, and particularly to a semiconductor memory device and a memory system including the semiconductor memory device.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims.

What is claimed is:

1. An on-die termination (ODT) circuit, comprising:
an ODT control circuit configured to determine an ODT status based on a read latency control signal (RL) in order to generate an ODT control signal; and
an ODT section being activated/deactivated in response to the ODT control signal,
wherein the ODT control circuit is further configured to generate the ODT control signal in response to the read latency control signal (RL) and a clock enable signal.

2. The ODT circuit of claim 1, wherein the ODT circuit is configured to compensate for an impedance mismatch of a data bus (DQ) in a memory system.

3. The ODT circuit of claim 1, wherein the ODT circuit is configured to compensate for an impedance mismatch of a command/address (C/A) bus in a memory system.

4. An on-die termination (ODT) circuit, comprising:
an ODT control circuit configured to determine an ODT status based on a read latency control signal (RL) in order to generate an ODT control signal; and
an ODT section being activated/deactivated in response to the ODT control signal,
wherein the ODT control circuit is further configured to generate the ODT control signal in response to the read latency control signal (RL) and a write latency control signal (WL).

5. The ODT circuit of claim 1, wherein the ODT section is electrically coupled to a pad coupling an external bus and an internal bus.

6. The ODT circuit of claim 5, wherein the external bus is configured to operate as a command/address (C/A) bus.

7. The ODT circuit of claim 5, wherein the external bus is configured to operate as a data (DQ) bus.

8. The ODT circuit of claim 5, wherein the ODT section comprises:
a Metal Oxide Semiconductor (MOS) transistor being switched ON/OFF in response to the ODT control signal; and
a termination resistor coupled between the MOS transistor and the pad.

9. An on-die termination (ODT) circuit, comprising:
an ODT control circuit configured to determine an ODT status based on a write latency control signal (WL) in order to generate an ODT control signal; and
an ODT section being activated/deactivated in response to the ODT control signal,
wherein the ODT control circuit is further configured to generate the ODT control signal in response to the write latency control signal (WL) and a clock enable signal.

10. An on-die termination (ODT) circuit, comprising:
an ODT control circuit configured to generate an ODT control signal in response to a read latency control signal (RL) and an ODT status signal; and
an ODT section being activated/deactivated in response to the ODT control signal.

11. The ODT circuit of claim 10, wherein the ODT control circuit receives the read latency control signal and the ODT status signal from a mode register write (MRW) register.

12. The ODT circuit of claim 11, wherein values of the read latency control signal and the ODT status signal stored in the MRW register are updated by a user.

13. The ODT circuit of claim 10, wherein the ODT control circuit is further configured to generate the ODT control signal in response to the read latency control signal (RL), the ODT status signal, and a write latency control signal (WL).

14. The ODT circuit of claim 10, wherein the ODT control circuit is further configured to generate the ODT control signal in response to the read latency control signal (RL), the ODT status signal, and a clock enable signal.

15. A memory system, comprising:
a memory controller that generates a command/address signal (CA) and a data signal; and
a memory module including a plurality of semiconductor memory device that each operate in response to the command/address signal (CA) and data signal and that each includes an on-die termination (ODT) circuit, wherein the ODT circuit comprises;
an ODT control circuit configured to determine an ODT status in response to a read latency control signal (RL) in order to generate an ODT control signal; and
an ODT section being activated/deactivated in response to the ODT control signal,
wherein the ODT control circuit is further configured to generate the ODT control signal in response to the read latency control signal (RL) and a write latency control signal (WL).

16. The memory system of claim 15, wherein the ODT circuit is configured to compensate an impedance mismatch of a data bus in the memory system.

17. The memory system of claim 15, wherein the ODT circuit is configured to compensate for an impedance mismatch of a command/address bus in the memory system.

* * * * *